United States Patent
Lu et al.

(10) Patent No.: US 11,063,213 B2
(45) Date of Patent: Jul. 13, 2021

(54) METHOD FOR MANUFACTURING MEMORY DEVICE

(71) Applicant: TAIWAN SEMICONDUCTOR MANUFACTURING CO., LTD., Hsinchu (TW)

(72) Inventors: Chih-Wei Lu, Hsinchu (TW); Hsi-Wen Tien, Hsinchu County (TW); Wei-Hao Liao, Taichung (TW); David Dai, New Taipei (TW); Chung-Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/664,815

(22) Filed: Oct. 26, 2019

(65) Prior Publication Data
US 2020/0066976 A1    Feb. 27, 2020

Related U.S. Application Data

(62) Division of application No. 15/706,709, filed on Sep. 16, 2017, now Pat. No. 10,461,246.

(51) Int. Cl.
| | |
|---|---|
| H01L 47/00 | (2006.01) |
| H01L 43/12 | (2006.01) |
| H01L 45/00 | (2006.01) |
| H01L 27/22 | (2006.01) |
| H01L 43/02 | (2006.01) |
| H01L 27/24 | (2006.01) |
| H01L 43/08 | (2006.01) |

(52) U.S. Cl.
CPC ............ *H01L 43/12* (2013.01); *H01L 27/228* (2013.01); *H01L 27/249* (2013.01); *H01L 27/2436* (2013.01); *H01L 27/2463* (2013.01); *H01L 43/02* (2013.01); *H01L 43/08* (2013.01); *H01L 45/04* (2013.01); *H01L 45/1233* (2013.01); *H01L 45/1253* (2013.01); *H01L 45/146* (2013.01); *H01L 45/16* (2013.01)

(58) Field of Classification Search
CPC ... H01L 43/12; H01L 27/228; H01L 27/2436; H01L 27/2463; H01L 27/249; H01L 43/02; H01L 43/08; H01L 45/04; H01L 45/1233; H01L 45/1253; H01L 45/146; H01L 45/16
See application file for complete search history.

(56) References Cited

U.S. PATENT DOCUMENTS

| | | | |
|---|---|---|---|
| 9,431,603 B1 | 8/2016 | Hsieh et al. | |
| 10,090,465 B2 * | 10/2018 | Hsu | H01L 45/04 |

(Continued)

*Primary Examiner* — Victor A Mandala
*Assistant Examiner* — Colleen E Snow
(74) *Attorney, Agent, or Firm* — Maschoff Brennan

(57) ABSTRACT

A method includes depositing a bottom electrode layer, a resistance switching element layer, and a top electrode layer over a first dielectric layer; etching the top electrode layer and the resistance switching element layer to form a resistance switching element over the bottom electrode layer and a top electrode over the resistance switching element; depositing a metal-containing compound layer over the top electrode, the resistance switching element, and the bottom electrode layer; and etching the metal-containing compound layer and the bottom electrode layer to form a bottom electrode over the first dielectric layer.

20 Claims, 10 Drawing Sheets

(56) References Cited

U.S. PATENT DOCUMENTS

| | | |
|---|---|---|
| 2010/0044669 A1 | 2/2010 | Happ et al. |
| 2010/0314602 A1 | 12/2010 | Takano et al. |
| 2011/0291066 A1* | 12/2011 | Baek .................... H01L 45/146 257/4 |
| 2014/0252298 A1 | 9/2014 | Li et al. |
| 2017/0117467 A1* | 4/2017 | Chang .................... H01L 45/16 |

* cited by examiner

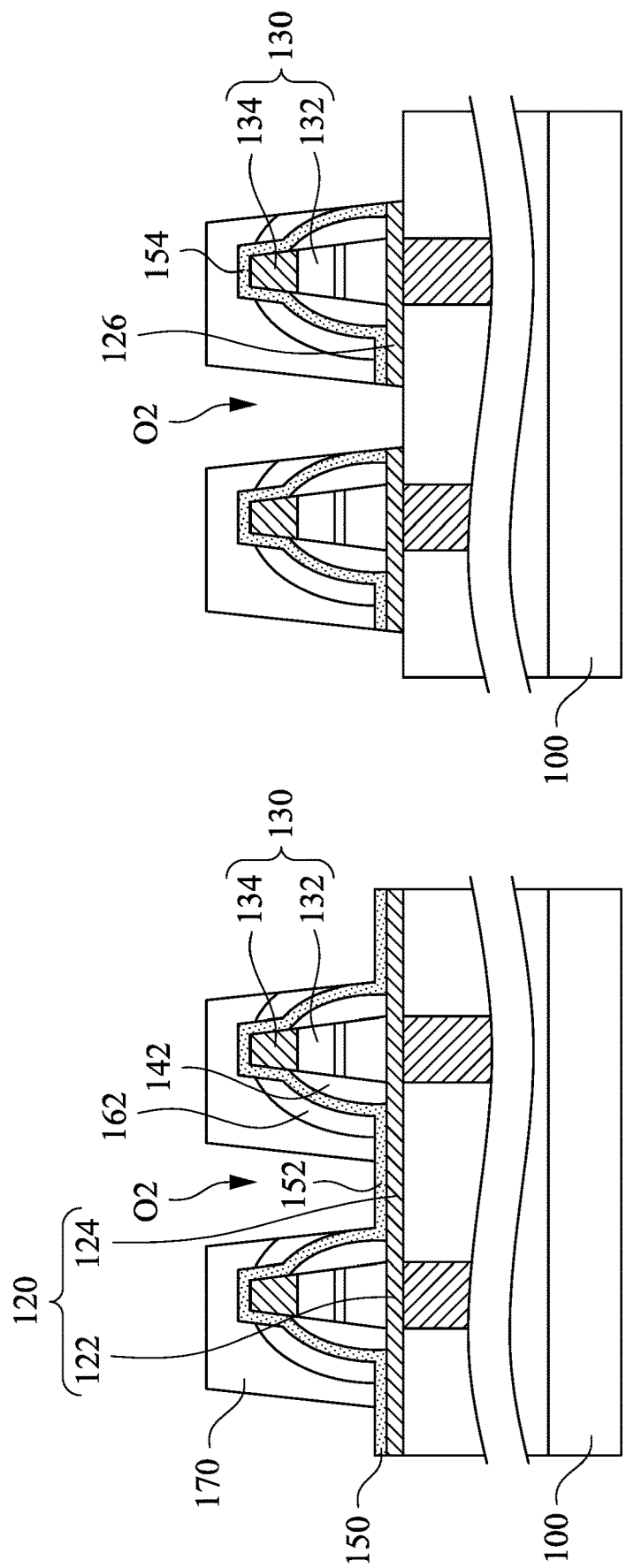

METHOD FOR MANUFACTURING MEMORY DEVICE

PRIORITY CLAIM AND CROSS-REFERENCE

This application is a divisional application of U.S. patent application Ser. No. 15/706,709, filed Sep. 16, 2017, now U.S. Pat. No. 10,461,246, issued Oct. 29, 2019, which is herein incorporated by reference in its entirety.

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 2B are cross-sectional views of an integrated circuit in various stages of fabrication in accordance with some embodiments of the present disclosure.

DETAILED DESCRIPTION

Figure 1A:
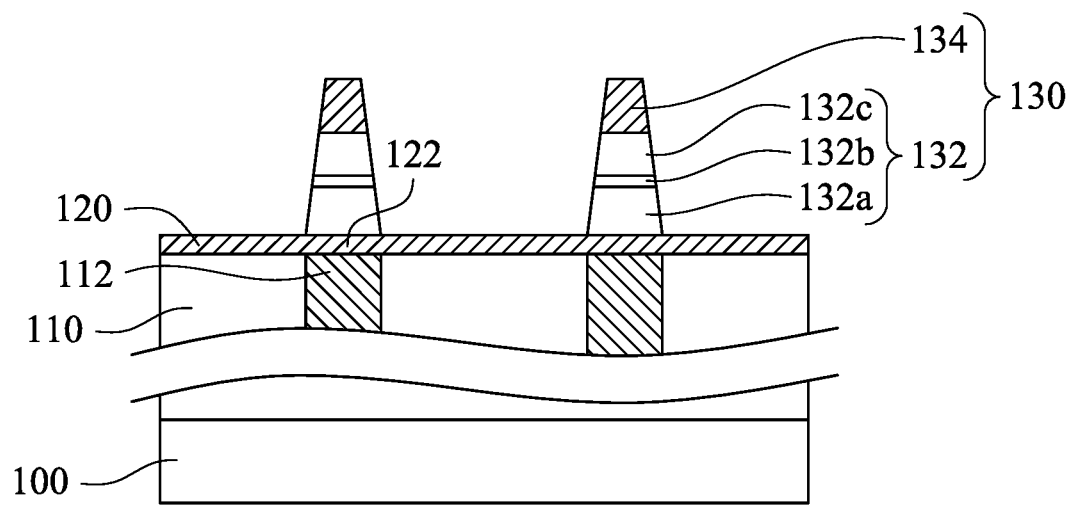
FIGS. 1A through 1M are cross-sectional views of an integrated circuit in various stages of fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetic random-access memory (MRAM) device and the method of forming the same are provided in accordance with various exemplary embodiments. The intermediate stages of forming the MRAM device are illustrated. The variations of the embodiments are discussed. Throughout the various views and illustrative embodiments, like reference numbers are used to designate like elements.

FIGS. 1A through 1M are cross-sectional views of an integrated circuit (IC) in various stages of fabrication in accordance with some embodiments of the present disclosure. FIG. 1A illustrates a wafer having a substrate 100 thereon. The substrate 100 includes an interlayer dielectric (ILD) layer or inter-metal dielectric (IMD) layer 110 with metallization pattern 112. The ILD layer 110 may be an extra low-k dielectric (ELK) layer, such as carbon doped silicon dioxide, may be an oxide, such as silicon oxide, and/or may be the like or a combination thereof. In some embodiments, the ILD layer 110 may be formed of a low-k dielectric material having a k value less than about 3.9. The k value of the ILD layer 110 may even be lower than about 2.8. The metallization pattern 112 may be copper, aluminum, the like, and/or a combination thereof. The substrate 100 may also include active and passive devices, for example, underlying the ILD layer 110. These further components are omitted from the figures for clarity, and how these components are formed will be readily apparent to a person having ordinary skill in the art.

A bottom electrode layer 120 is formed over the ILD layer 110. The bottom electrode layer 120 may be formed of conductive materials, such as copper, aluminum, tantalum, tungsten, tantalum nitride (TaN), titanium, titanium nitride (TiN), the like, and/or a combination thereof. The bottom electrode layer 120 may be a single-layered structure or a multilayered structure. For example, the bottom electrode layer 120 may include a tantalum nitride layer and a titanium nitride layer over the tantalum nitride layer. In some embodiments, the bottom electrode layer 120 has a thickness in a range from about 50 angstroms to about 1000 angstroms. The bottom electrode layer 120 can be formed using suitable deposition techniques, such as chemical vapor deposition (CVD), physical vapor deposition (PVD), atomic layer deposition (ALD), the like, and/or combinations thereof.

Stacks 130 are then formed over first portions 122 of the bottom electrode layer 120 respectively. Each of the stacks 130 includes a resistance switching element 132 and a top electrode 134 over the resistance switching element 132. Regarding the formation of the stacks 130, a resistance switching element layer and a top electrode layer may be formed in sequence on the bottom electrode layer 120, and then be patterned into the resistance switching element 132 and the top electrode 134. The resistance switching element layer and the top electrode layer may be formed using suitable deposition techniques, such as CVD, PVD, ALD, the like, and/or combinations thereof. In some embodiments, the resistance switching element 132 may include a magnetic tunnel junction (MTJ) structure including various layers formed of different combinations of materials. In some exemplary embodiments where the resistance switching element 132 includes the MTJ structure, it may include a pinning layer 132a, a tunnel barrier layer 132b, and a free layer 132c. In addition, the MTJ structure may have other variations including other layers, such as anti-ferro-magnetic layers. In some embodiments, the pinning layer 132a is formed of PtMn, the tunnel barrier layer 132b is formed of MgO, and the free layer 132c is formed of CoFeB. The magnetic moment of the free layer 132c may be programmed causing the resistance of the resulting MTJ cell to be changed between a high resistance and a low resistance. In some embodiments, the top electrode 134 may be formed of conductive materials, such as copper, aluminum, tantalum, tungsten, tantalum nitride (TaN), titanium, titanium nitride (TiN), the like, and/or a combination thereof.

In some embodiments where resistive random access memory (RRAM) cells are to be formed on the wafer, the resistance switching element 132 may include a RRAM dielectric layer such as metal oxide composite, such as hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$) as in its relative high resistance state and a metal such as titanium (Ti), hafnium (Hf), platinum (Pt), ruthenium (Ru), and/or aluminum (Al) as in its relative low resistance state.

Figure 1B:
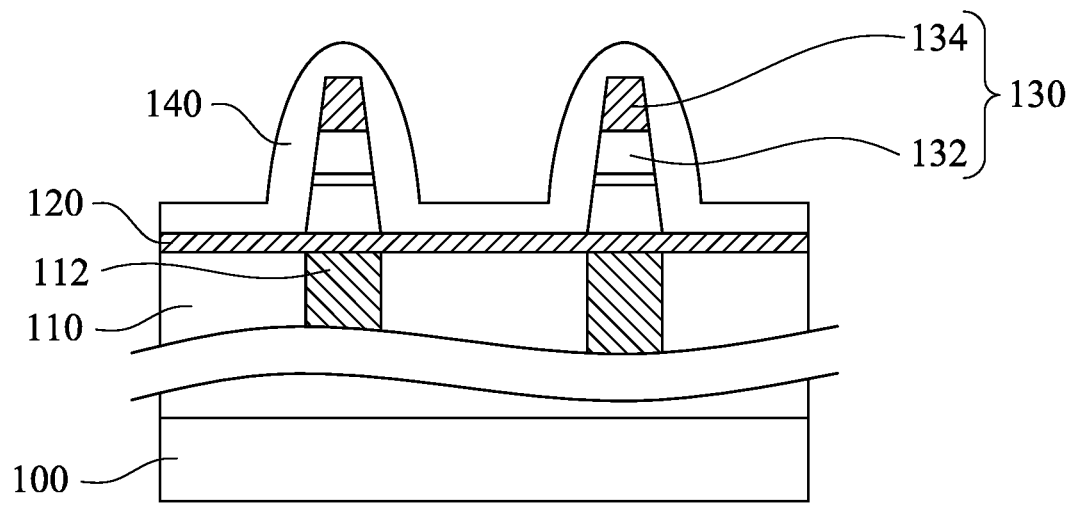

Reference is made to FIG. 1B. A first spacer layer 140 is blanket formed over the bottom electrode layer 120 and over sidewalls and top surfaces of the stacks 130. The first spacer layer 140 may include suitable dielectric materials such as silicon nitride, silicon carbide, carbon-doped silicon nitride, carbon-doped silicon oxide, silicon oxynitride, and combinations thereof. In some embodiments, the first spacer layer 140 may also be a composite layer including two or more layers made of different materials, such as a silicon nitride/silicon carbide stack. The first spacer layer 140 may be formed using CVD, PVD, ALD, the like, and/or combinations thereof.

Figure 1C:
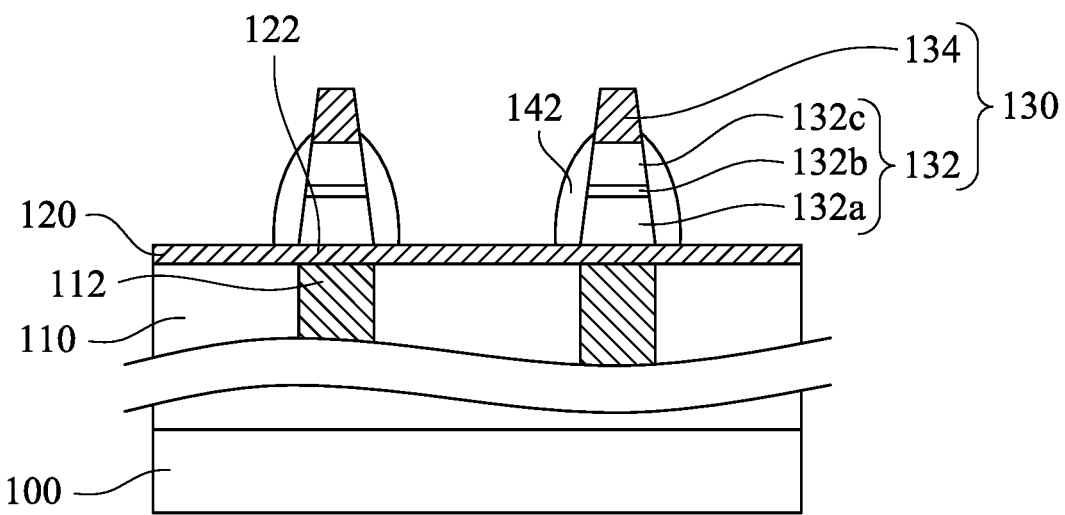

FIG. 1C illustrates patterning of the first spacer layer 140. The patterning process removes horizontal portions of the first spacer layer 140 while remaining vertical portions of the first spacer layer 140 around the resistance switching element 132 and the top electrode 134. The remaining portions of the first spacer layer 140 can be referred to as spacers 142. In some embodiments, the spacers 142 cover sidewalls of the resistance switching element 132 and leave the top electrode 134 and portions of the bottom electrode layer 120 uncovered. In some embodiments, the patterning of the first spacer layer 140 may include an etch process, such as an anisotropic etch using acceptable photolithography techniques. The patterning process may be dry etching, wet etching, or a combination thereof. In some other embodiments, the formation of the spacers 142 may be omitted. In some embodiments where the first spacer layer 140 is silicon nitride, the patterning of the silicon nitride layer includes a dry etching using $CH_2F_2$ as an etchant, although other applicable etchants may be used.

Figure 1D:
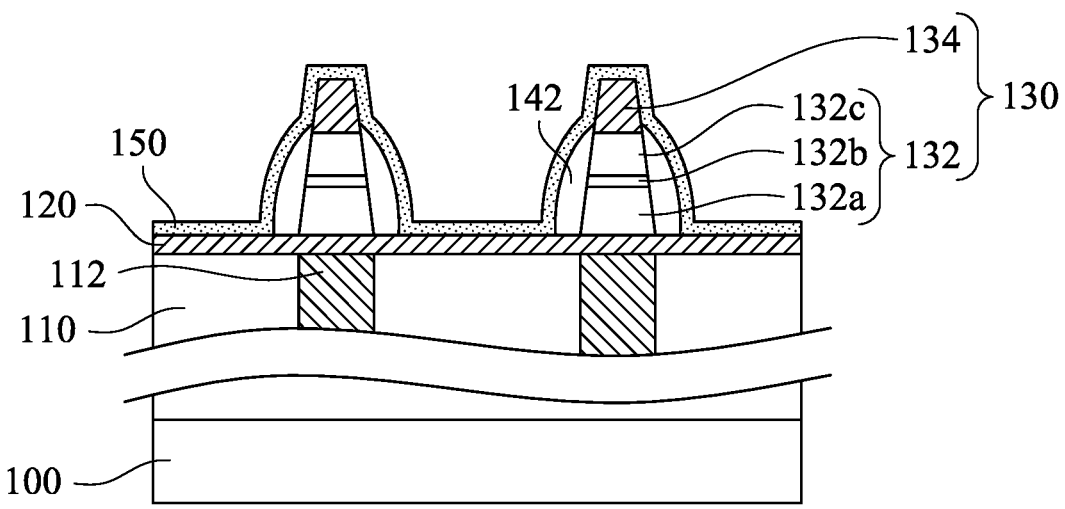

Reference is made to FIG. 1D. A penetration barrier layer 150 is conformally formed over the bottom electrode layer 120, around the spacers 142, and over the top electrode 134. In some embodiments, the penetration barrier layer 150 may act as an etch resistant layer against one or more subsequent etching processes. The penetration barrier layer 150 may be a metal oxide layer different from materials of the spacers 140. In some embodiments, the penetration barrier layer 150 is a metal oxide layer. For example, the penetration barrier layer 150 includes materials such as aluminum oxide ($AlO_x$), aluminium oxynitride (AlON), tungsten carbide (WC), titanium nitride (TiN), tantalum nitride (TaN), titanium oxide (TiO), tantalum oxide (TaO), the like, and/or a combination thereof.

Figure 1E:
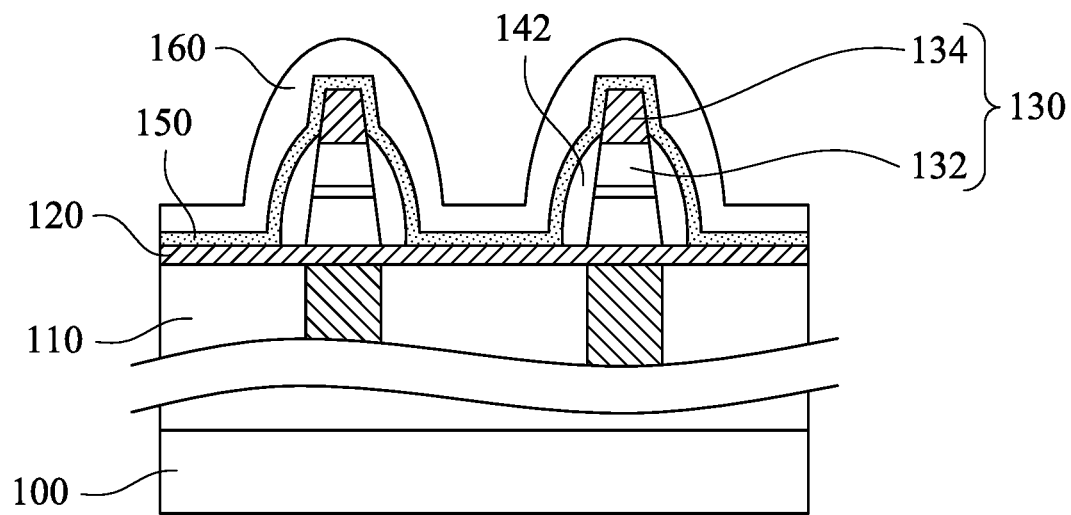

Reference is made to FIG. 1E. A second spacer layer 160 is blanket formed over the penetration barrier layer 150. The second spacer layer 160 may include a material different from the penetration barrier layer 150. For example, the second spacer layer 160 includes suitable dielectric materials such as silicon nitride, silicon carbide, carbon-doped silicon nitride, carbon-doped silicon oxide, silicon oxynitride, and combinations thereof. In some embodiments, the second spacer layer 160 may also be a composite layer including two or more layers made of different materials, such as a silicon nitride/silicon carbide stack. The second spacer layer 160 may be formed using CVD, PVD, ALD, the like, and/or combinations thereof. In some embodiments, the first spacer layer 140 (referring to FIG. 1B) is formed at a first temperature, the second spacer layer 160 is formed at a second temperature higher than the first temperature, such that a density of the second spacer layer 160 is greater than a density of the spacer 142. In other some embodiments, the second spacer layer 160 may be omitted.

Figure 1F:
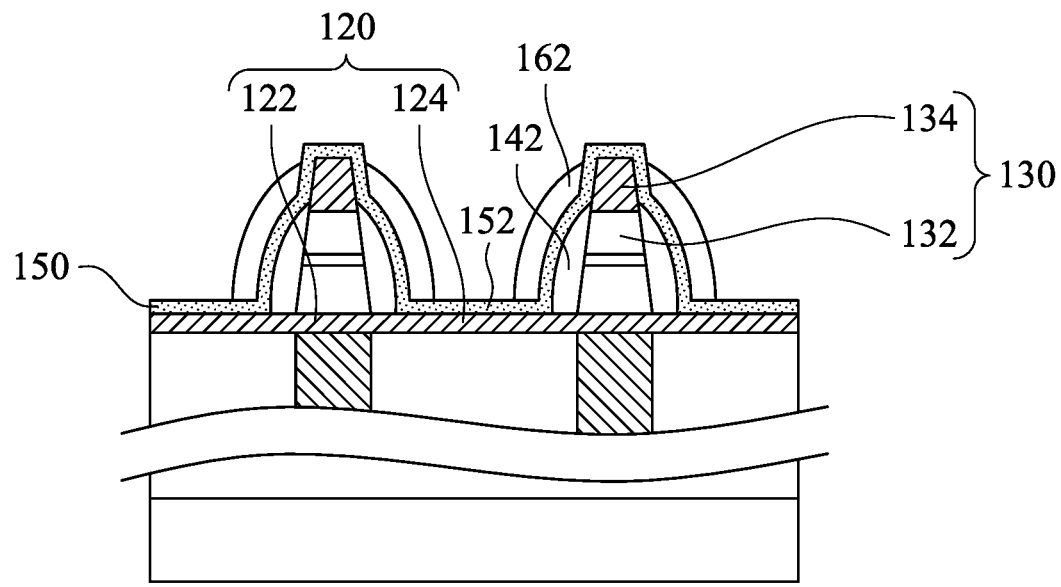

FIG. 1F illustrates patterning of the second spacer layer 160. The patterning process removes horizontal portions of the second spacer layer 160 while remaining portions of the second spacer layer 160 around the stacks 130 and the spacers 142. The remaining portions of the second spacer layer 160 can be referred to as spacers 162. In some embodiments, the spacers 162 cover sidewalls of the stacks 130 and expose portions of the penetration barrier layer 150 over the top electrode 134. In some embodiments, the spacers 162 expose portions 152 of the penetration barrier layer 150 over second portions 124 of the bottom electrode layer 120. In some embodiments, the spacers 162 are separated due to the patterning process.

In some embodiments, the patterning of the second spacer layer 160 may include an etch process, such as an anisotropic etch using acceptable photolithography techniques. The patterning process may be dry etching, wet etching, or a combination thereof. In some embodiments, the penetration barrier layer 150 has higher etch resistance to an etchant used in the patterning the second spacer layer 160 than that of the second spacer layer 160, such that the penetration barrier layer 150 protects the stack 130 and the spacers 142 from being damaged during the patterning of the second spacer layer 160. In some embodiments where the second spacer layer 160 is silicon nitride, the patterning of the silicon nitride layer includes a dry etching using $CH_2F_2$ as an etchant, although other applicable etchants may be used.

Figure 1G:
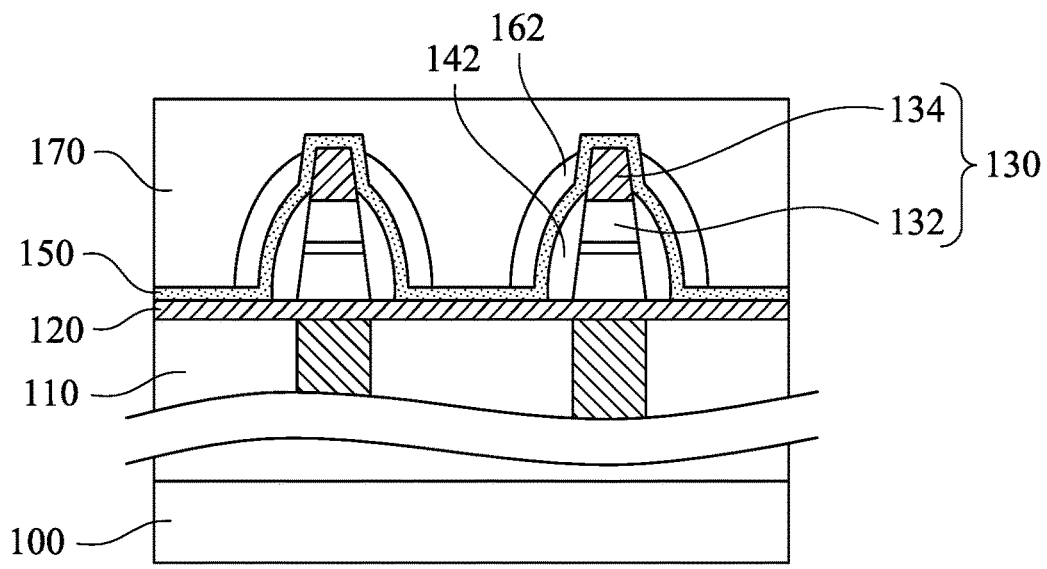

Reference is made to FIG. 1G. An interlayer dielectric (ILD) layer 170 is formed on the resulting structure of FIG. 1F and around the penetration barrier layer 150. The ILD layer 170 may have the same material as the underlying ILD layer 110. The ILD layer 170 may be an extra low-k dielectric (ELK) layer, such as carbon doped silicon dioxide, may be an oxide, such as silicon oxide, and/or may be the like or a combination thereof. In some embodiments, the ILD layer 170 may be formed of a low-k dielectric material having a k value less than about 3.9. The k value of the ILD layer 170 may even be lower than about 2.8.

Figure 1H:
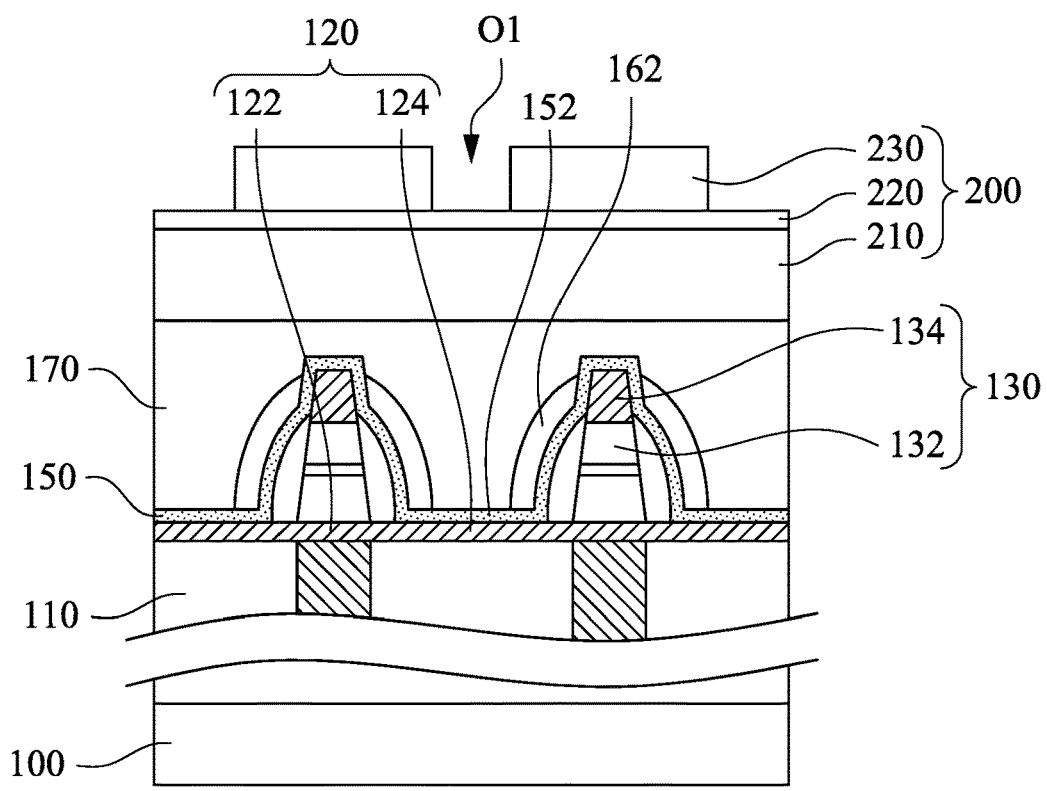

Reference is made to FIG. 1H. A tri-layer photoresist 200 is formed on the interlayer dielectric (ILD) layer 170. The tri-layer photoresist 200 includes a bottom layer 210, a middle layer 220, and a top layer 230. In some embodiments, the bottom layer 210 includes a $C_xH_yO_z$ material, the middle layer 220 includes a $SiC_xH_yO_z$ material, and the top layer 230 includes a $C_xH_yO_z$ material. The $C_xH_yO_z$ material of the bottom layer 210 may be identical to the $C_xH_yO_z$ material of the top layer 230 in some embodiments, but they may also be different in other embodiments. The top layer 230 also includes a photo-sensitive element, such as a photo-acid generator (PAG). This allows a photolithography process to be performed to pattern the top layer 230. It is understood that in other embodiments, one or more layers of the tri-layer photoresist may be omitted, or additional layers may be provided as a part of the tri-layer photoresist, and the layers may be formed in difference sequences.

In some embodiments, the top layer 230 is patterned by a photolithography process, which may include one or more exposure, developing, rinsing, and baking processes (not necessarily performed in this order). The photolithography process patterns the top layer 230 into a photoresist mask, which may have one or more trenches or openings O1 respectively over the second portions 124 of the bottom electrode layer 120 uncovered by the stacks 130 and the spacers 142 and 162. The trenches or openings O1 expose the middle layer 220 therebelow. The middle layer 220 is then etched using the photoresist mask to form a patterned middle layer, and the bottom layer 210 is then etched using the patterned middle layer to form a patterned bottom layer. The patterned bottom layer 210 is then used to pattern the ILD layer 170. In other some embodiments, the photoresist 200 may include a single photoresist layer, and the photoresist layer is patterned and then used to pattern the ILD layer 170.

Figure 1I:
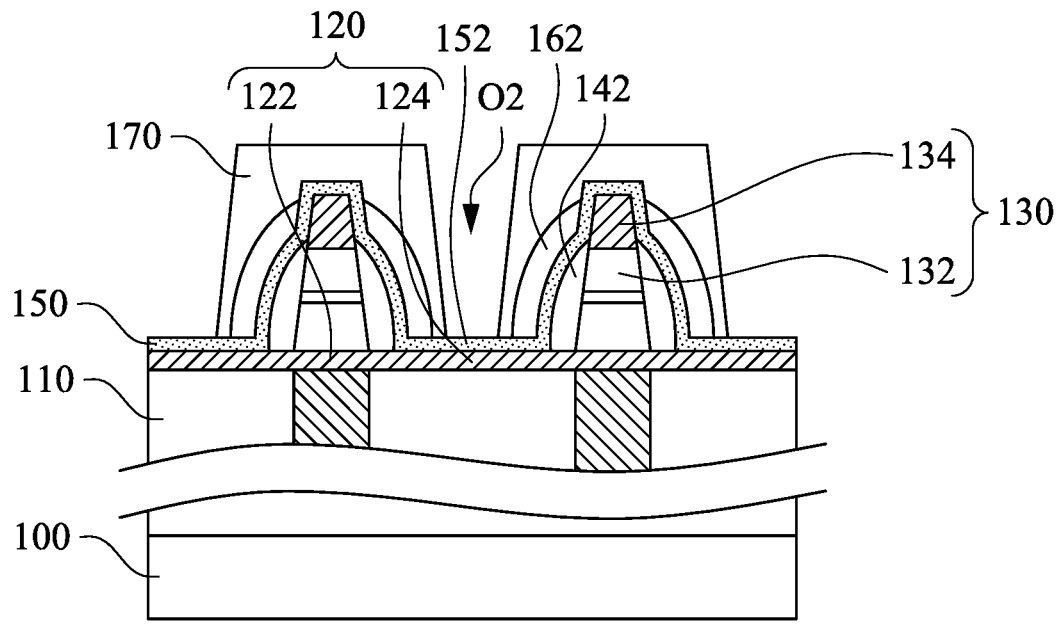

Reference is made to FIG. 1I. One or more trenches or opening O2 are then etched in the ILD layer 170 using the photoresist 200 as an etch mask, so as to expose portions 152 of the penetration barrier layer 150 over the second portions 124 of the bottom electrode layer 120. To be specific, a portion of the ILD layer 170 over the second portion 124 of the bottom electrode layer 120 is removed until reaching the portion 152 of the penetration barrier layer 150. In some embodiments, the penetration barrier layer 150 has higher etch resistance to an etchant used in the removing the portion of the ILD layer 170 (or the etching the openings O2) than that of the ILD layer 170 and the spacers 142 and 162, such that the penetration barrier layer 150 may protect the spacers 142 and 162 and the bottom electrode layer 120 from being damage in the etching the openings O2. In some embodiments where the ILD layer 170 is silicon oxide, the etchant used in etching the openings O2 can be dilute hydrofluoric acid (HF), HF vapor, $CF_4$, $C4F_8$, $CH_xF_y$, $C_xF_y$, $SF_6$, or $NF_3$ gas. For example, in an etching process using dilute HF, HF vapor, $CF_4$, $C_4F_8$, $CH_xF_y$, $C_xF_y$, $SF_6$, or $NF_3$ gas as an etchant, an etch rate of the penetration barrier layer 150 is slower than that of at least one of the spacers 142, 162 and the ILD layer 170. After the etching process, the tri-layer photoresist 200 can be removed using, for example, an ashing process.

Figure 1J:
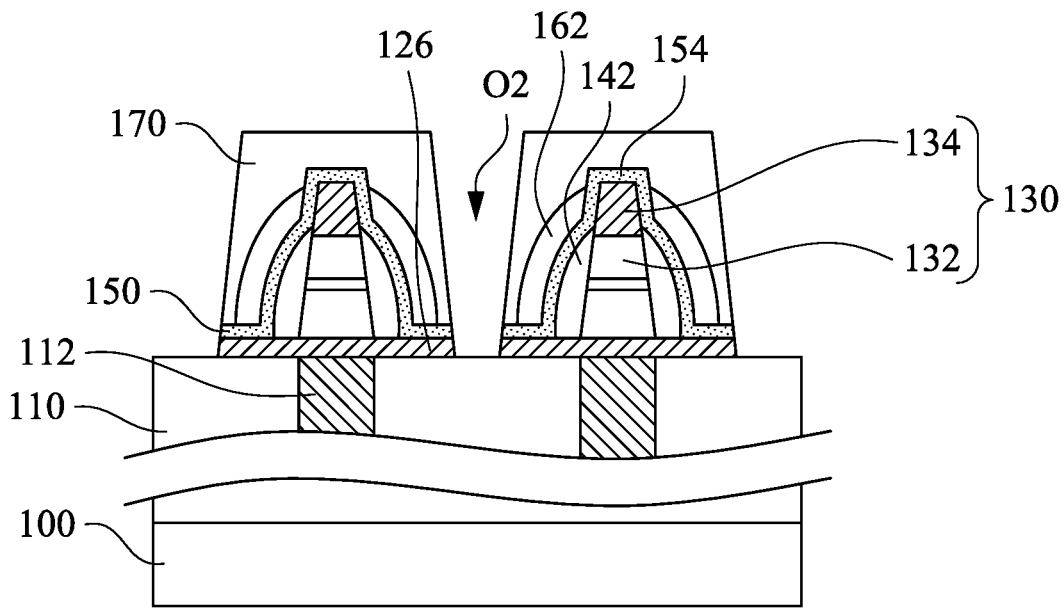

Reference is made to FIG. 1J. The portions 152 of the penetration barrier layer 150 under the openings O2 are removed through the openings O2 while remaining penetration barrier layers 154 over the respective stacks 130 and the respective spacers 142. In some embodiments, the remaining penetration barrier layers 154 may be around or enclose the respective spacers 142, and the spacers 162 are around or enclose the respective remaining penetration barrier layers 154.

Then, the bottom electrode layer 120 is patterned to remove the second portions 124 of the bottom electrode layer 120 under the openings O2 and form the bottom electrodes 126. The bottom electrodes 126 are in contact with the metallization pattern 112. The bottom electrode layer 120 can be patterned using the patterned ILD layer 170 as an etch mask, and hence the bottom electrode layer 120 can be patterned in a self-aligned manner. In some embodiments, the patterning process may include one or more etching operations, such as dry etching, wet etching or a combination thereof. In some embodiments, the patterning process may include a dry etching using chlorine based, fluorine based, or oxygen containing gaseous etchant such as CO, $O_2$, $CO_2$, $CF_4$, $CH_2F_2$, $C_4F_8$, $NF_3$, $SF_6$, $Cl_2$, $BCl_3$ and/or other chemicals, as example. In some embodiments, the remaining penetration barrier layers 154 have higher resistance to penetration of the chlorine based, fluorine based, or oxygen containing gaseous etchant than that of at least one of the spacers 142 and 162 and the ILD layer 170, such that the stack 130 including the resistance switching element 132 may be protected from the invasion of the chlorine based, fluorine based, or oxygen containing gaseous etchant by the penetration barrier layer 150 during the patterning the bottom electrode layer 120. For example, the penetration barrier layers 154 have higher resistance to penetration of chlorine, fluorine, or oxygen than that of the spacer layers 142, 162 and the ILD layer 170. For example, a penetration rate of chlorine, fluorine, or oxygen through the penetration barrier layer 154 is slower than that through at least one of the spacers 142, 162 and the ILD layer 170. As a result, the penetration barrier layer 154 can protect the resistance switching element 132 against penetration of chlorine, fluorine, or oxygen.

Figure 1K:
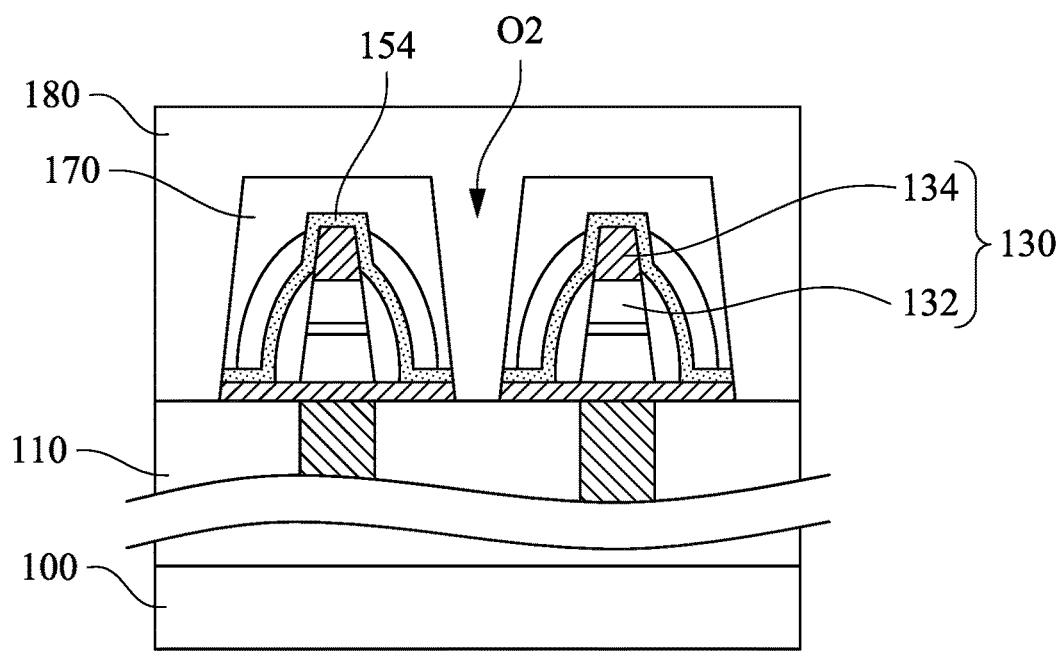

Reference is made to FIG. 1K. An interlayer dielectric (ILD) layer 180 is disposed on the resulting structure of FIG. 1J. The ILD layer 180 fills the openings O2 in the ILD layer 170. The ILD layer 180 may have the same material as the underlying ILD layers 110 and 170. The ILD layer 180 may be an extra low-k dielectric (ELK) layer, such as carbon doped silicon dioxide, may be an oxide, such as silicon oxide, and/or may be the like or a combination thereof.

Figure 1L:
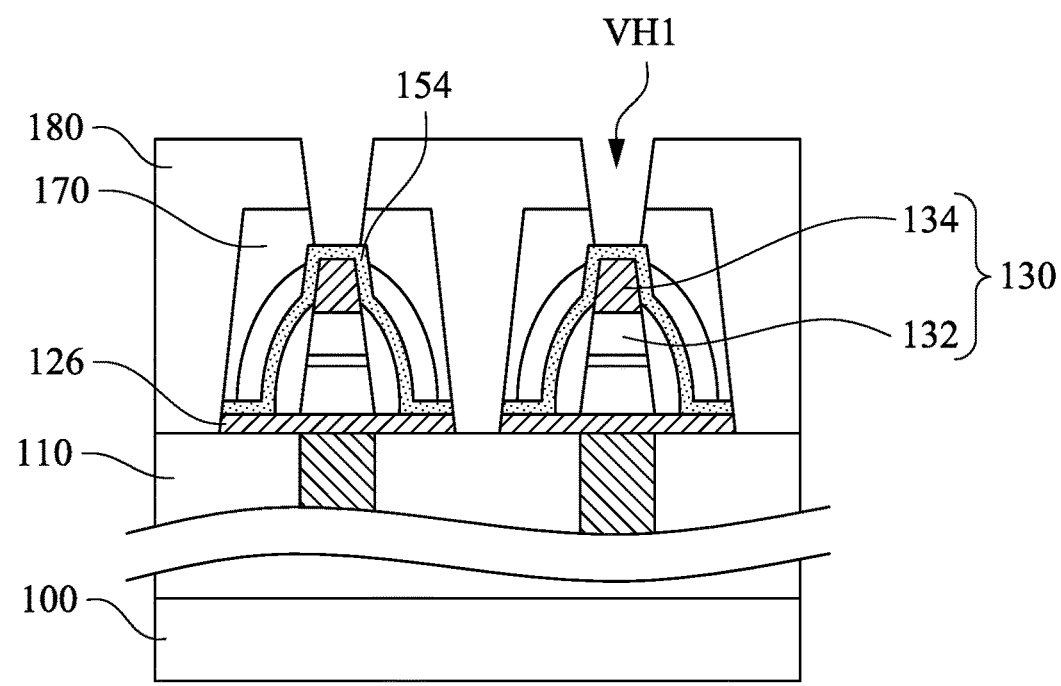

Reference is made to FIG. 1L A portion of the ILD layer 170 and a portion of the ILD layer 180 over the top electrode 134 are removed, such that top via holes VH1 are formed in the ILD layers 170 and 180. In some embodiments, the top via holes VH1 are etched in the ILD layers 170 and 180 until reaching portions of the remaining penetration barrier layers 154 over the top electrodes 134. In some embodiments, the remaining penetration barrier layers 154 have higher etch resistance to the etching the top via holes VH1 than that of the ILD layers 170 and 180, so that the penetration barrier layers 154 can act as etch stop layers for stopping or slowing down the etching process of forming the top via holes VH1. For example, in this etching process, etch rates of the penetration barrier layers 154 are slower than etch rates of the ILD layers 170 and 180. In some embodiments where the ILD layers 170 and 180 are silicon oxide, the etchant used in etching the top via holes VH1 can be dilute HF, HF vapor, $CF_4$, $C4F_8$, $CH_xF_y$, $C_xF_y$, $SF_6$, or $NF_3$ gas.

Figure 1M:
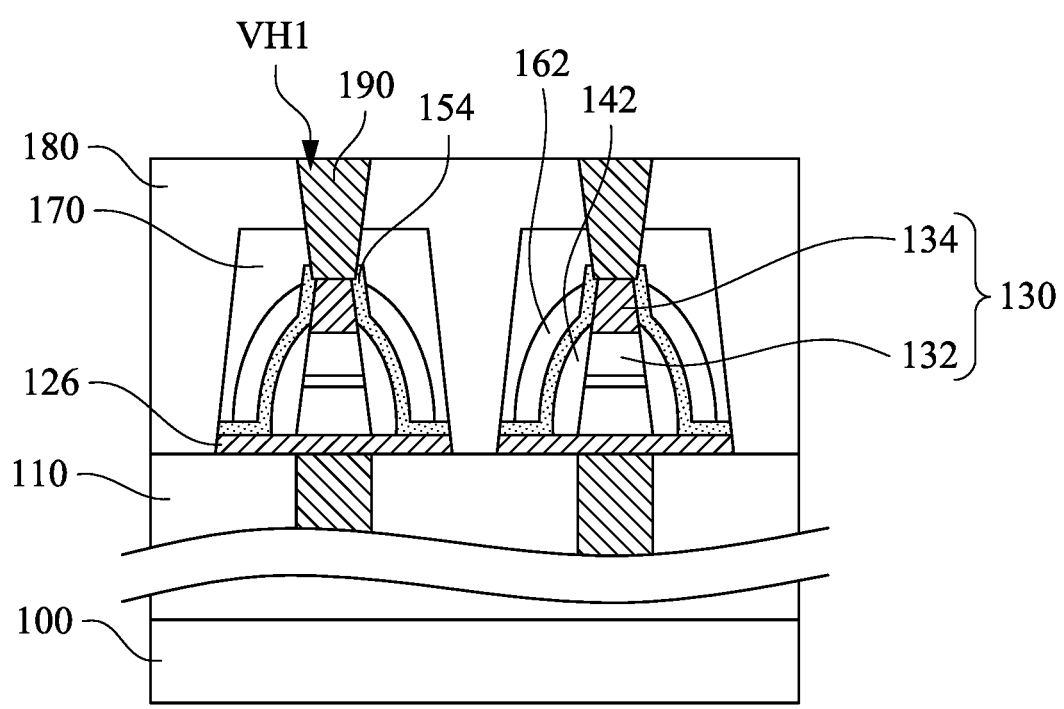

Reference is made to FIG. 1M. A portion of the remaining penetration barrier layers 154 exposed by the top via holes VH1 is removed, such that the top electrodes 134 are exposed. Then, conductors 190 are formed into the top via holes VH1 respectively and in contact with the top electrodes 134 respectively. The conductors 190 may include conductive material, such as metal. The conductors 190 may also include one or more liner and barrier layers in additional to a metal conductor. The liner and/or barrier may be conductive and deposited using CVD or PVD. The metal may be deposited using PVD or one of the plating methods, such as electrochemical plating. A planarization process, such as a CMP process, is then performed to planarize the conductors 190 and the ILD layer 180.

As illustrated in FIG. 1M, a memory device includes a bottom electrode 126, a resistance switching element 132, a top electrode 134, an ILD layer 170, spacers 142 and 162, and a penetration barrier layer 154 is formed. The resistance switching element 132 is sandwiched between the bottom electrode 126 and the top electrode 134. The ILD layer 170 surrounds the resistance switching element 132. The spacers 142 and 162 are between the ILD layer 170 and a sidewall of the resistance switching element 132. The penetration barrier layers 154 is between the ILD layer 170 and the sidewall of the resistance switching element 132, and thereby protect the resistance switching element 132 from the penetration of etchant used in patterning the bottom electrode layer. In some embodiments, the penetration barrier layer 150 may also act as an etch stop layer for various etching processes, such as the etching processes as shown in FIGS. 1F, 1I and 1L.

FIGS. 2A through 2B are cross-sectional views of an integrated circuit in various stages of fabrication in accordance with some embodiments of the present disclosure. As illustrated in FIG. 2A, in some condition, the trenches or openings O1 of the top layer 230 of the tri-layer photoresist 200 (referring to FIG. 1H) are misaligned with the second portions 124 of the bottom electrode layer 120 uncovered by the stacks 130 and the spacers 142 and 162 due to poor overlay (OVL) control, such that the etching the openings O2 may further etching portions of the spacers 162. However, since the penetration barrier layer 150 has higher etch resistance against the etching the openings O2 compared with the spacers 162, vertical portions of the penetration barrier layer 150 at inner sides of the spacers 162 will not be removed by this etching process, so that the inner spacers 142 and the stacks 130 can be protected from the etching process even if the outer spacers 162 are unexpectedly removed due to the photolithographic misalignment. Therefore, OVL control in the photolithography process can be relaxed, which means the process window of the photolithography process can be enlarged.

FIG. 2B shows the portion 152 of the penetration barrier layer 150 and the second portion 124 of the bottom electrode layer 120 are removed through the opening O2, while leaving remaining penetration barrier layers 154 and bottom electrodes 126 over the substrate 100. In some embodiments, the patterning process are described in the foregoing context and thus not described herein for clarity.

Figure 3:
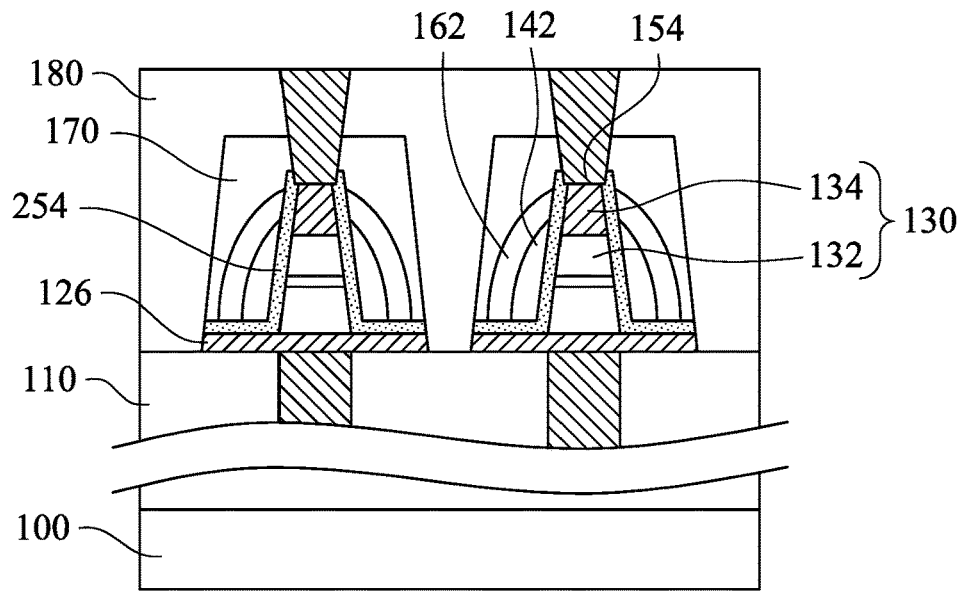
FIG. 3 is a cross-sectional view of an integrated circuit in accordance with some embodiments of the present disclosure.

FIG. 3 is a cross-sectional view of another integrated circuit in accordance with some embodiments of the present disclosure. This IC shares some of the features of the IC as illustrated in FIG. 1M. For example, the IC may include a substrate 100 and ILD layers 110, 170 and 180 as described above. Additionally, a penetration barrier layer 254 may be formed in contact with a sidewall of the stack 130, and the spacers 142 and 162 are concentrically arranged around the penetration barrier layer 254. The penetration barrier layer 254 is a metal oxide layer and includes materials such as aluminum oxide ($AlO_x$), aluminium oxynitride (AlON), tungsten carbide (WC), titanium nitride (TiN), tantalum nitride (TaN), titanium oxide (TiO), tantalum oxide (TaO), the like, and/or a combination thereof.

Figure 4:
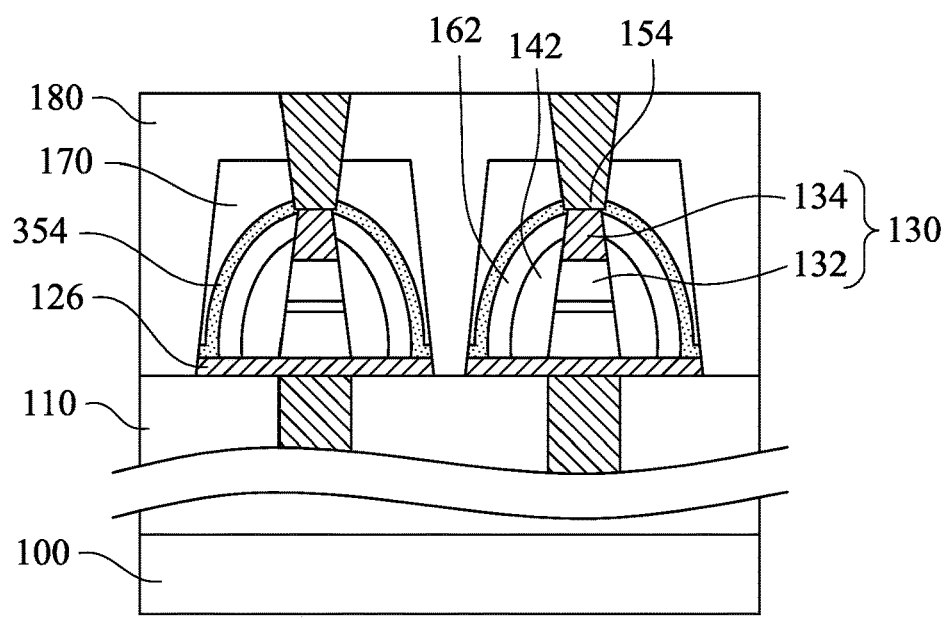
FIG. 4 is a cross-sectional view of another integrated circuit in accordance with some embodiments of the present disclosure.

FIG. 4 is a cross-sectional view of another integrated circuit in accordance with some embodiments of the present disclosure. This IC shares some of the features of the IC as illustrated in FIG. 1M. For example, the IC may include a substrate 100 and ILD layers 110, 170 and 180 as described above. Additionally, a penetration barrier layer 354 may be formed concentrically around the spacers 142 and 162. The penetration barrier layer 354 is a metal oxide layer and includes materials such as aluminum oxide ($AlO_x$), aluminium oxynitride (AlON), tungsten carbide (WC), titanium nitride (TiN), tantalum nitride (TaN), titanium oxide (TiO), tantalum oxide (TaO), the like, and/or a combination thereof.

Other details of the present embodiments are similar to that of the embodiments of FIG. 1M, and therefore omitted herein.

Figure 5:
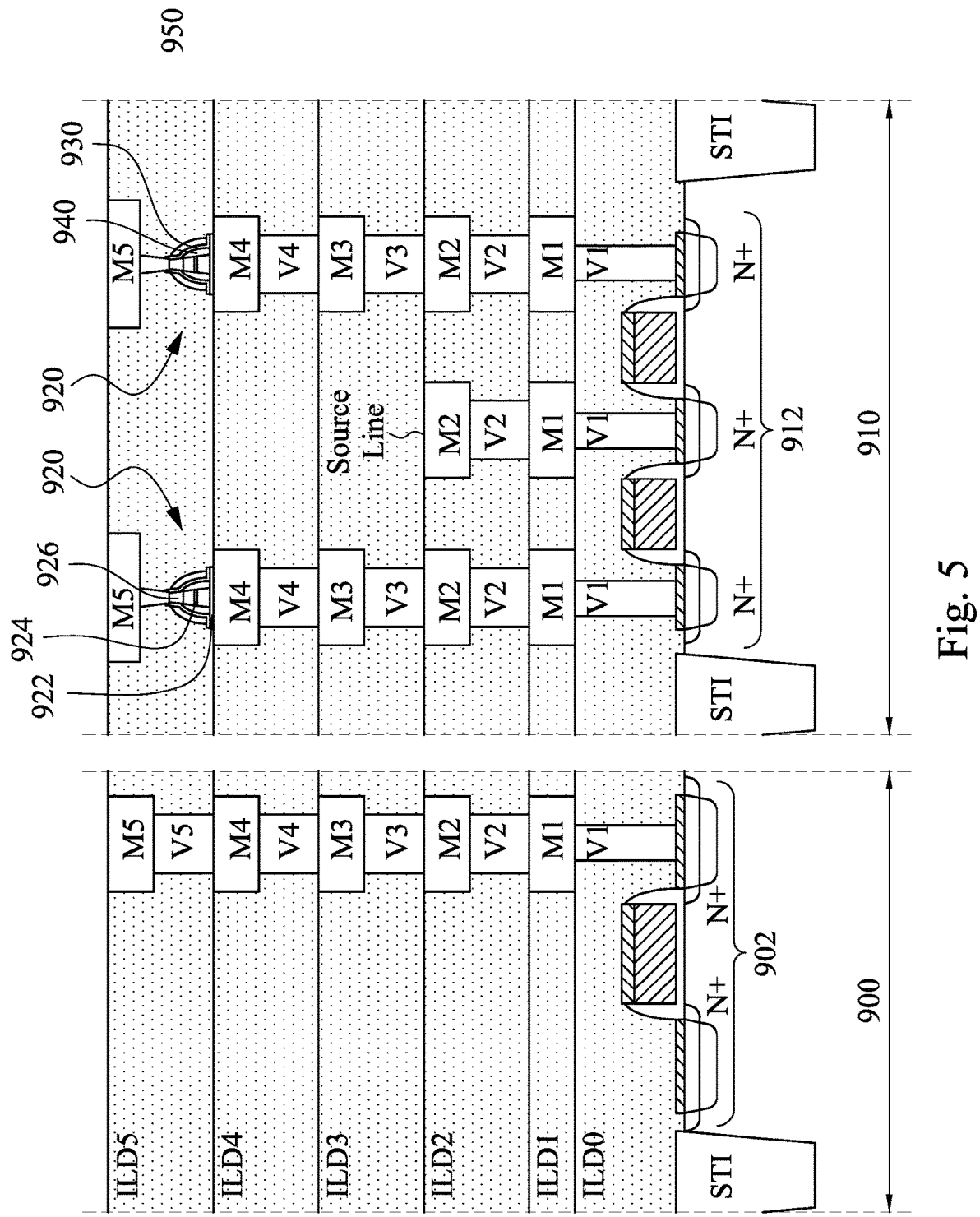
FIG. 5 is a cross-sectional view of another integrated circuit in accordance with some embodiments of the present disclosure.

FIG. 5 illustrates an integrated circuit in accordance with some embodiments. The integrated circuit includes a logic region 900 and a memory region 910. The logic region 900 may include circuitry, such as an exemplary logic transistor 902, for processing information received from memory cells 920 in the memory region 910 and for controlling reading and writing functions of memory cells 920. In some embodiments, the memory cell 920 may include a bottom electrode 922 and a top electrode 926, with a resistance switching element 924 sandwiched in between the bottom and top electrodes 922 and 926. Penetration barrier layers 930 are around sidewalls of the memory cell 920, respectively. Spacers 940 may be between the penetration barrier layers 930 and the sidewalls of the memory cell 920, respectively. Spacers 950 may be around the penetration barrier layers 930, respectively.

As depicted, an exemplary integrated circuit is fabricated using five metallization layers, labeled as M1 through M5, with five layers of metallization vias or interconnects, labeled as V1 through V5. Other embodiments may contain more or fewer metallization layers and a corresponding more or fewer number of vias. Logic region 900 includes a full metallization stack, including a portion of each of metallization layers M1-M5 connected by interconnects V2-V5, with V1 connecting the stack to a source/drain contact of the logic transistor 902. The memory region 910 includes a full metallization stack connecting the memory cells 920 to transistors 912 in the memory region 910, and a partial metallization stack connecting a source line to the transistors 912 in the memory region 910. The memory cells 920 are depicted as being fabricated in between the M4 layer and the M5 layer. Also included in integrated circuit is a plurality of ILD layers. Six ILD layers, identified as ILD0 through ILD5 are depicted in FIG. 5 as spanning the logic region 900 and the memory region 910. The ILD layers may provide electrical insulation as well as structural support for the various features of the integrated circuit during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the penetration barrier layer around the resistance switching element has higher resistance to penetration of the chlorine based or fluorine based etchant than that of the spacers and the ILD layer, such that the penetration barrier layer protects the resistance switching element from the invasion of the etchant during the patterning the bottom electrode layer. Another advantage is that the penetration barrier layer may have higher etch resistance to the spacers and the ILD layers, such that the penetration barrier layer may also act as an etch stop layer in the etching the spacer layers or the ILD layers.

According to some embodiments of the present disclosure, a method includes depositing a bottom electrode layer, a resistance switching element layer, and a top electrode layer over a first dielectric layer; etching the top electrode layer and the resistance switching element layer to form a resistance switching element over the bottom electrode layer and a top electrode over the resistance switching element; depositing a metal-containing compound layer over the top electrode, the resistance switching element, and the bottom electrode layer; and etching the metal-containing compound layer and the bottom electrode layer to form a bottom electrode over the first dielectric layer.

According to some embodiments of the present disclosure, a method includes depositing a bottom electrode layer, a resistance switching element layer, and a top electrode layer over a first dielectric layer; etching the top electrode layer and the resistance switching element layer to form a resistance switching element over the bottom electrode layer and a top electrode over the resistance switching element; depositing a first spacer layer over the top electrode, the resistance switching element, and the bottom electrode layer; etching the first spacer layer to form a first spacer surrounding the resistance switching element; and forming a metal-containing compound layer extending along a sidewall of the first spacer.

According to some embodiments of the present disclosure, a method includes forming a top electrode and a resistance switching element over a bottom electrode layer, wherein the top electrode is over the resistance switching element; depositing a metal-containing compound layer over the top electrode, the resistance switching element, and the bottom electrode layer; depositing a first dielectric layer over the metal-containing compound layer; etching the first dielectric layer and the metal-containing compound layer to form a via hole that exposes the top electrode; and filling the via hole with a conductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   depositing a bottom electrode layer, a resistance switching element layer, and a top electrode layer over a first dielectric layer;
   etching the top electrode layer and the resistance switching element layer to form a resistance switching element over the bottom electrode layer and a top electrode over the resistance switching element;
   depositing a metal-containing compound layer over the top electrode, the resistance switching element, and the bottom electrode layer, wherein a bottom surface of the metal-containing compound layer is in contact with a top surface of the bottom electrode layer; and
   etching the metal-containing compound layer and the bottom electrode layer to form a bottom electrode over the first dielectric layer.

2. The method of claim 1, further comprising:
   prior to depositing the metal-containing compound layer, depositing a spacer layer over the top electrode, the resistance switching element, and the bottom electrode layer; and
   etching the spacer layer to form a spacer surrounding the resistance switching element.

3. The method of claim 2, wherein etching the spacer layer is performed such that a top of the spacer is higher than a bottom of the top electrode.

4. The method of claim 1, further comprising:
   prior to etching the metal-containing compound layer and the bottom electrode layer, depositing a spacer layer over the metal-containing compound layer; and
   etching the spacer layer to form a spacer disposed along a sidewall of the metal-containing compound layer.

5. The method of claim 4, further comprising:
   prior to etching the metal-containing compound layer and the bottom electrode layer, etching the spacer to expose a portion of the metal-containing compound layer.

6. The method of claim 4, wherein etching the spacer layer to form the spacer is performed such that a top of the metal-containing compound layer is higher than a top of the spacer.

7. The method of claim 1, further comprising:
   prior to etching the metal-containing compound layer and the bottom electrode layer, depositing a second dielectric layer over the metal-containing compound layer; and
   prior to etching the metal-containing compound layer and the bottom electrode layer, etching the second dielectric layer to expose a portion of the metal-containing compound layer, wherein etching the metal-containing compound layer comprises etching the exposed portion of the metal-containing compound layer.

8. The method of claim 7, further comprising:
   after etching the metal-containing compound layer and the bottom electrode layer, depositing a third dielectric layer over the first dielectric layer and the second dielectric layer.

9. The method of claim 8, further comprising:
   etching the third dielectric layer, the second dielectric layer, and the metal-containing compound layer to form a via hole that exposes the top electrode; and
   filling the via hole with a conductor.

10. The method of claim 9, wherein etching the third dielectric layer, the second dielectric layer, and the metal-containing compound layer is performed such that a bottom of the via hole is lower than a top of the metal-containing compound layer.

11. A method, comprising:
    depositing a bottom electrode layer, a resistance switching element layer, and a top electrode layer over a first dielectric layer;
    etching the top electrode layer and the resistance switching element layer to form a resistance switching element over the bottom electrode layer and a top electrode over the resistance switching element;
    depositing a first spacer layer over the top electrode, the resistance switching element, and the bottom electrode layer;
    etching the first spacer layer to form a first spacer surrounding the resistance switching element;

forming a metal-containing compound layer extending along a sidewall of the first spacer; and patterning the bottom electrode layer into a bottom electrode, such that the bottom electrode is below bottoms of the resistance switching element and the first spacer and extending beyond an entire width of a combination of the resistance switching element and the first spacer.

12. The method of claim 11, wherein forming the metal-containing compound layer is performed such that a top of the metal-containing compound layer is higher than a top of the first spacer.

13. The method of claim 11, further comprising:
depositing a second spacer layer over the metal-containing compound layer; and
etching the second spacer layer to form a second spacer disposed along a sidewall of the metal-containing compound layer.

14. The method of claim 11, wherein forming the metal-containing compound layer is performed such that the metal-containing compound layer has a portion extending along a top surface of the bottom electrode layer.

15. The method of claim 14, further comprising:
depositing a second spacer layer over the metal-containing compound layer; and
etching the second spacer layer to form a second spacer over the portion of the metal-containing compound layer that extends along the top surface of the bottom electrode layer.

16. The method of claim 15, wherein etching the second spacer layer is performed such that the portion of the metal-containing compound layer that extends along the top surface of the bottom electrode layer extends beyond an entire width of a bottom surface of the second spacer.

17. A method, comprising:
forming a top electrode and a resistance switching element over a bottom electrode layer, wherein the top electrode is over the resistance switching element, and the bottom electrode layer has a first portion below the resistance switching element and a second portion free of coverage of the resistance switching element;
depositing a metal-containing compound layer over the top electrode, the resistance switching element, and the first and second portions of the bottom electrode layer;
depositing a first dielectric layer over the metal-containing compound layer;
etching the first dielectric layer and the metal-containing compound layer to form a via hole that exposes the top electrode; and
filling the via hole with a conductor.

18. The method of claim 17, further comprising:
prior to etching the first dielectric layer and the metal-containing compound layer to form the via hole, depositing a second dielectric layer over the first dielectric layer, wherein etching the first dielectric layer and the metal-containing compound layer to form the via hole comprises etching the second dielectric layer.

19. The method of claim 17, wherein filling the via hole with the conductor is performed such that the conductor is in contact with the metal-containing compound layer.

20. The method of claim 17, wherein etching the first dielectric layer and the metal-containing compound layer is performed such that a top of the metal-containing compound layer is higher than a top of the top electrode after etching the first dielectric layer and the metal-containing compound layer.

* * * * *